(12) United States Patent
Pulugurtha et al.

(10) Patent No.: US 9,761,590 B1
(45) Date of Patent: Sep. 12, 2017

(54) PASSING ACCESS LINE STRUCTURE IN A MEMORY DEVICE

(71) Applicant: Micron Technology, Inc., Boise, ID (US)

(72) Inventors: Srinivas Pulugurtha, Boise, ID (US); Sourabh Dhir, Boise, ID (US); Rajesh N. Gupta, Devarabisnahalli (IN); Sanh D. Tang, Boise, ID (US); Si-Woo Lee, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/162,028

(22) Filed: May 23, 2016

(51) Int. Cl.
| | |
|---|---|
| *H01L 23/52* | (2006.01) |
| *H01L 27/108* | (2006.01) |
| *H01L 29/06* | (2006.01) |
| *H01L 27/088* | (2006.01) |
| *H01L 23/528* | (2006.01) |
| *G11C 11/4078* | (2006.01) |

(52) U.S. Cl.
CPC .... *H01L 27/10826* (2013.01); *G11C 11/4078* (2013.01); *H01L 23/528* (2013.01); *H01L 27/0886* (2013.01); *H01L 29/0649* (2013.01)

(58) Field of Classification Search
CPC ............. H01L 27/10826; H01L 23/528; H01L 27/0886; H01L 27/0649; G11C 11/4078
See application file for complete search history.

(56) References Cited

U.S. PATENT DOCUMENTS

| | | | |
|---|---|---|---|
| 8,404,543 B2* | 3/2013 | Shin | H01L 21/743 438/270 |
| 8,487,369 B2* | 7/2013 | Kim | H01L 27/10885 257/228 |
| 8,558,306 B2* | 10/2013 | Kim | H01L 21/76897 257/213 |
| 9,082,850 B2* | 7/2015 | Kim | H01L 27/10876 |
| 9,240,548 B2* | 1/2016 | Sills | H01L 45/08 |
| 9,349,737 B2* | 5/2016 | Pulugurtha | G11C 11/407 |
| 2005/0272233 A1* | 12/2005 | Lee | H01L 21/823437 438/585 |
| 2008/0014699 A1 | 1/2008 | Torek et al. | |
| 2010/0013047 A1* | 1/2010 | Thies | H01L 29/66181 257/532 |
| 2010/0258858 A1* | 10/2010 | Kim | H01L 29/66621 257/330 |
| 2015/0056781 A1 | 2/2015 | Akarvardar et al. | |
| 2016/0104709 A1 | 4/2016 | Pulugurtha et al. | |

* cited by examiner

*Primary Examiner* — Nicholas Tobergte
(74) *Attorney, Agent, or Firm* — Schwegman Lundberg & Woessner, P.A.

(57) ABSTRACT

A method for memory device fabrication includes forming a plurality of continuous fins on a substrate. An insulator material is formed around the fins. The continuous fins are etched into segmented fins to form exposed areas between the segmented fins. An insulator material is formed in the exposed areas wherein the insulator material in the exposed areas is formed higher than the insulator material around the fins. A metal is formed over the fins and the insulator material. The metal formed over the exposed areas is formed to a shallower depth than over the fins.

18 Claims, 14 Drawing Sheets

A-A'

B-B'

A-A'

B-B'

B-B'

B-B'

A-A'

PASSING ACCESS LINE STRUCTURE IN A MEMORY DEVICE

PRIORITY APPLICATION

This application is a continuation of U.S. application Ser. No. 14/511,371, filed Oct. 10, 2014, which is incorporated herein by reference in its entirety.

BACKGROUND

Memory devices are typically provided as internal, semiconductor, integrated circuits in apparatuses such as computers or other electronic devices. There are many different types of memory including non-volatile memory and volatile memory. Non-volatile memory can include memory such as read only memory (ROM), phase change memory, or flash. Volatile memory can include memory such as static random-access memory (SRAM), dynamic random access memory (DRAM), and synchronous dynamic random access memory (SDRAM).

A typical DRAM includes a plurality of memory cells, each memory cell being coupled to one bit line and two access lines (e.g., word lines), with one of the latter being a "passing" access line. A first portion of a access line can be active portion while a second portion of the access line can be an isolation portion. The active portion of the access line (e.g., active word line) can provide voltages to memory cells coupled to the active portion of the access line during a memory operation. The isolation portion of the access line can be at some reference voltage (e.g., ground) during the memory operations in order to isolate inactive memory cells during the memory operation. However, a voltage on the active portion of the access line can still disturb inactive memory cells coupled to the passing access line.

Thus, there are general needs to reduce access line disturb in a memory device.

DETAILED DESCRIPTION

Figure 1:
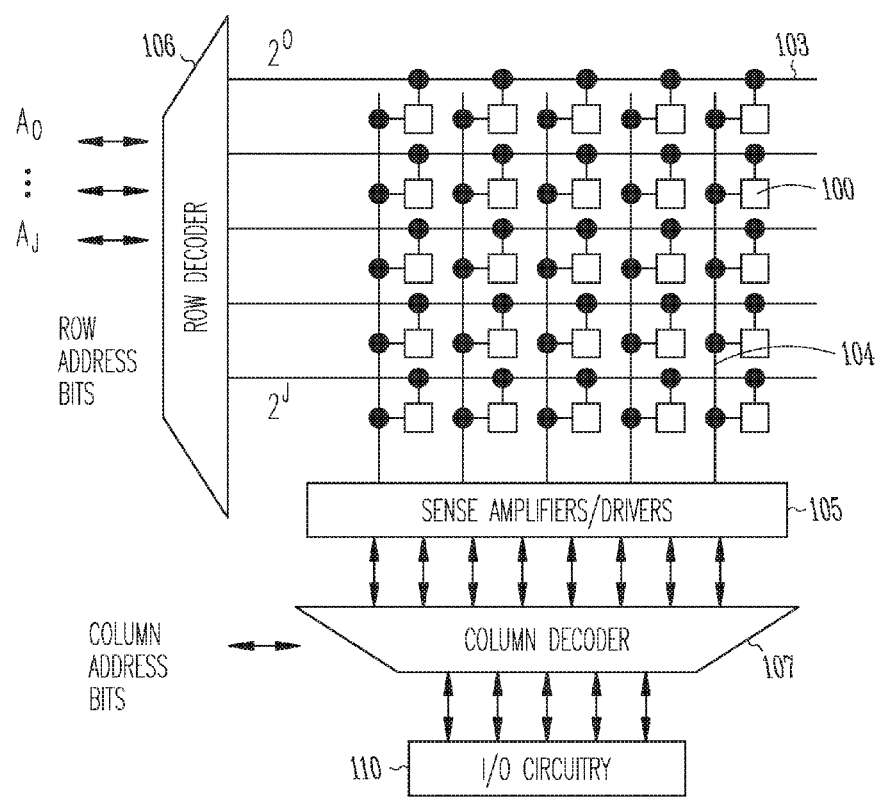
FIG. 1 illustrates a schematic diagram of an embodiment of a DRAM.

FIG. 1 illustrates a block diagram of an embodiment of a memory device (e.g., DRAM). The device comprises a plurality of memory cells 100, each memory cell 100 being coupled between an access line (e.g., word line) 103 and a data line (e.g., bit line) 104.

The data lines 104 are coupled to sense amplifiers/drivers 105 that can sense the states of the memory cells 100. The sensing can occur through sense amplifiers when the memory cell capacitors are coupled to the digit lines through their respective enabled control transistor.

A row decoder 106 is coupled to the access lines 103 to generate the access line signals in response to a row address from a controller. A column decoder 107 is coupled to the sense amplifiers/drivers 105 and generates a column address through drivers onto the digit lines 104 in response to a column address from the controller. The column decoder 107 also outputs the sensed states from the memory cells 100 as well as accepts the data to be stored in the memory cells 100.

The outputs from the column decoder 107 are input to the input/output (I/O) circuitry 110. The I/O circuitry 410 can include the DQ circuitry.

Figure 2:
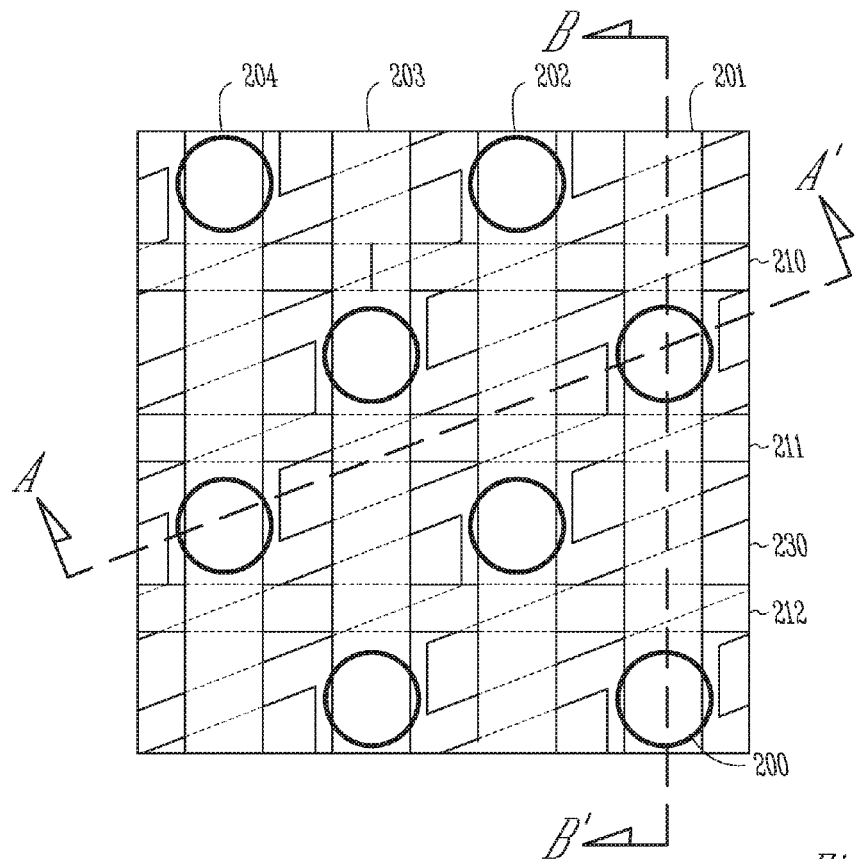
FIG. 2 illustrates a top view of a DRAM according to various embodiments.

FIG. 2 illustrates a top view of an embodiment of a DRAM according to various embodiments. The DRAM includes a plurality of access lines 201-204 formed vertically and a plurality of data lines 210-212 formed horizontally. A plurality of memory cell active areas 230 are shown as formed diagonally. A plurality of active chop (AC) mask areas 200 are shown in the circled areas. In the interest of clarity, not all of the memory cells 230 or AC mask areas 200 are labeled.

As discussed subsequently, the plurality of memory cell active areas 230 are initially formed as continuous active areas (e.g., first pattern). The continuous memory cell active areas 230 are then broken up by a second pattern that breaks the continuous regions and results in the final segmented active areas. This mask level can be referred to as the active chop (AC) mask.

Figure 3:
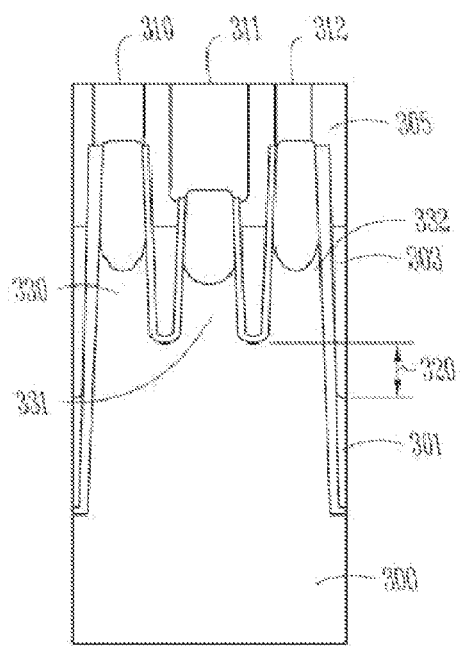
FIG. 3 illustrates a typical cross-sectional view of the DRAM of FIG. 2.

FIG. 3 illustrates a typical prior art cross-sectional view of the DRAM of FIG. 2. The cross-sectional view is along the A-A' axis shown in FIG. 2. This figure shows a shallow trench isolation (STI) nitride fill area 301 between a substrate 300 (e.g., silicon, germanium) and a metal 303 that is part of an access line. The STI nitride fill area 301 can be considered an AC region and is recessed to form a "saddle" region (see 420, 421 of FIG. 4) for the access line metal 303. When the STI nitride fill area 301 is recessed, it is etched away from all of the regions and the access line is formed deep in the AC region. In this region 301, the access line acts as a passing access line.

FIG. 3 further illustrates a nitride insulator 305 over the access line metal 303. Memory cells 310-312 are formed over fins 330-332 (e.g., silicon, germanium) extending from the substrate 300. A typical prior art distance 320 between a passing access line and an active access line depth is illustrated.

Figure 4:
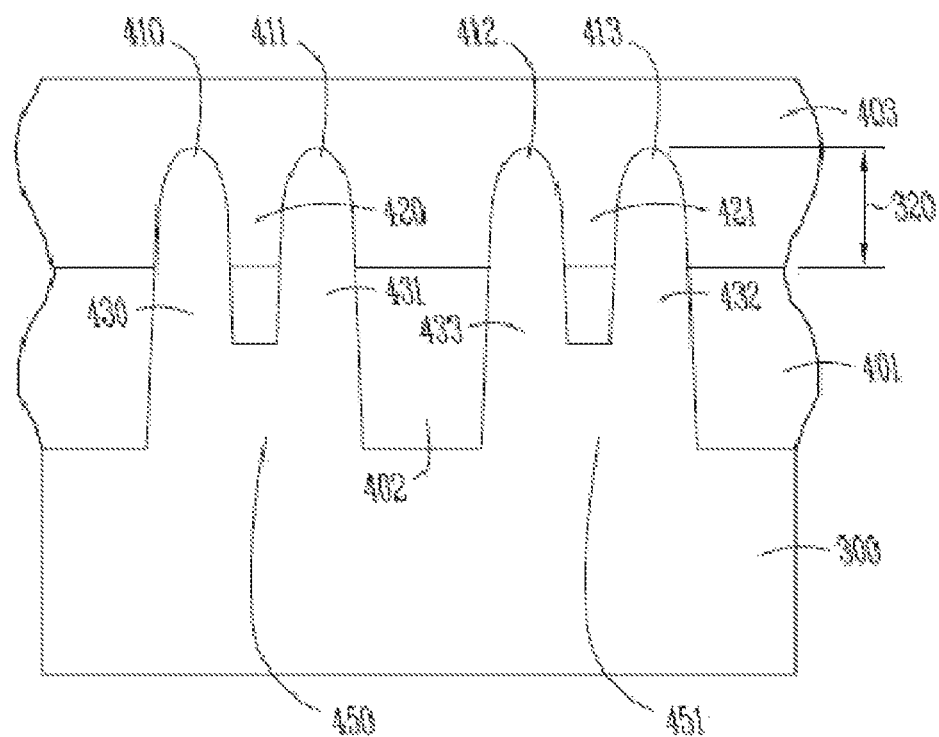
FIG. 4 illustrates another typical cross-sectional view of the DRAM of FIG. 2.

FIG. 4 illustrates another typical prior art cross-sectional view of the DRAM of FIG. 2. This cross-sectional view is along the B-B' axis shown in FIG. 2. This cross-section view shows the substrate 300 (e.g., silicon, germanium) with fins 430-433 (e.g., silicon, germanium) that form the saddle regions 420, 421 between pairs of adjacent fins 430, 431 and 432, 433. The tops of these fins 410-413 include the active areas 410-413 for the memory cells. Pairs of adjacent fins 430, 431 and 432, 433 make up respective structures that each includes a different saddle region 420, 421.

The STI nitride AC regions 401, 402 are shown formed over the substrate 300. The access line metal 403 is formed over the STI nitride AC regions 401, 402.

As in FIG. 3, this figure shows the relatively substantial prior art distance 320 between a passing access line and an active access line depth. This distance 320 can result in relatively high passing access line disturb.

Figure 5A:
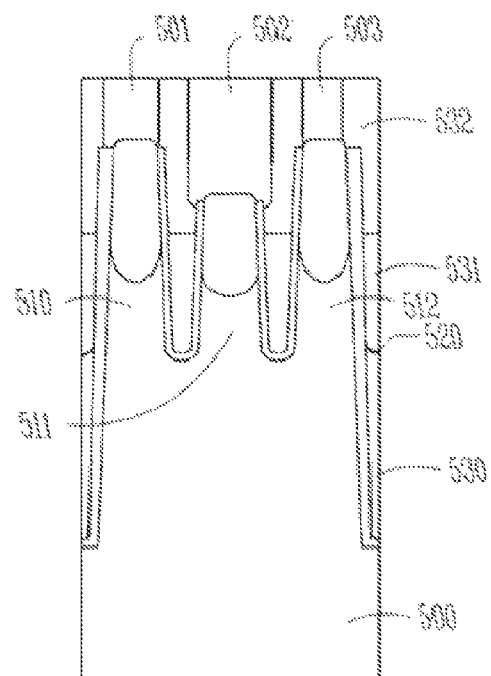
FIGS. 5A, 5B and 5C illustrate cross-sectional views of a DRAM incorporating an architecture to reduce access line disturb.
Figure 5B:
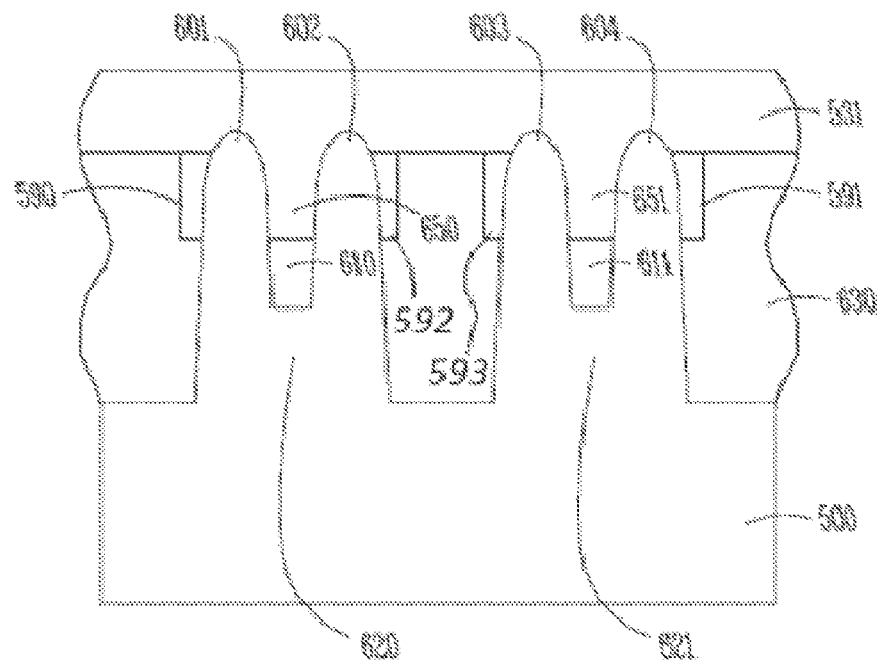
Figure 5C:
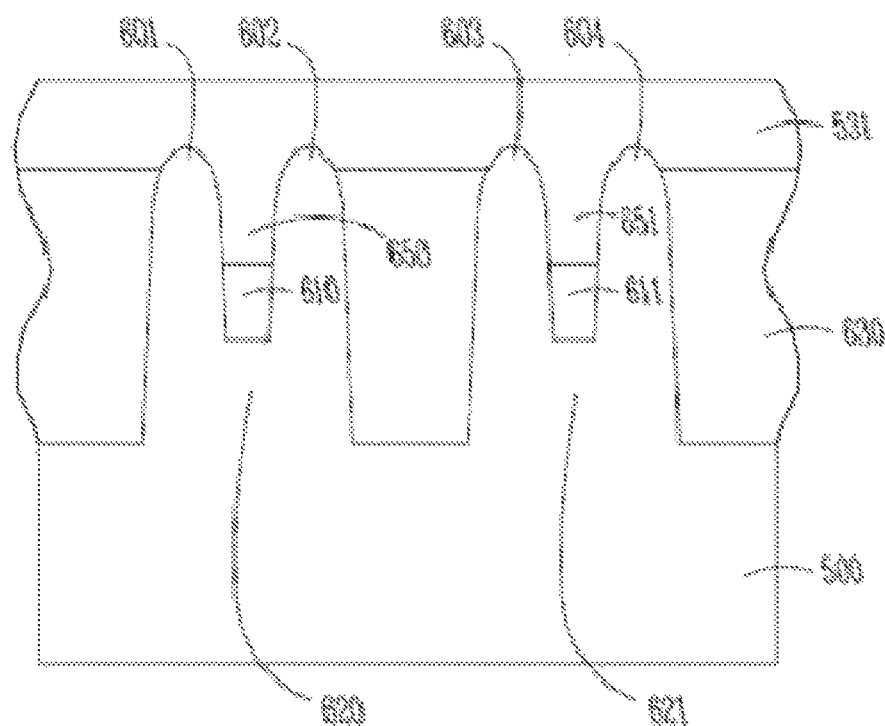
Figure 6A:
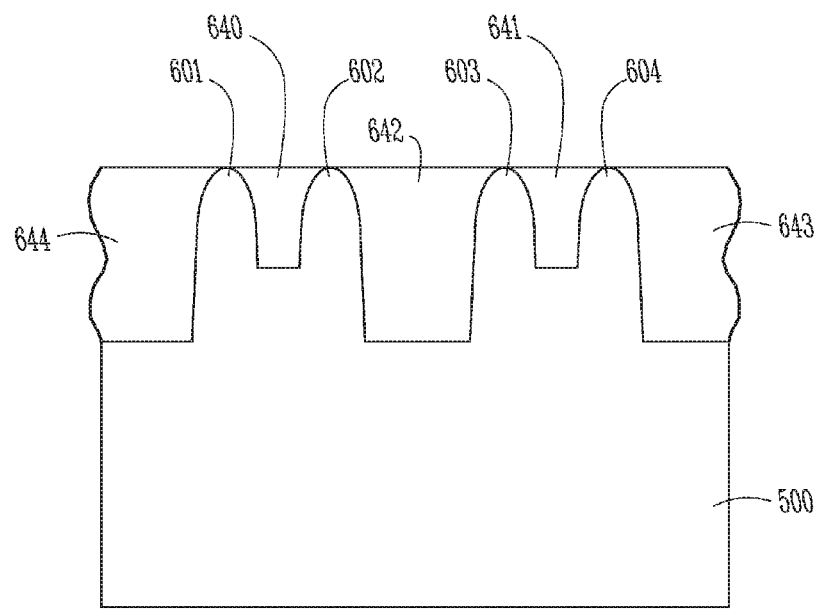
FIGS. 6A and 6B illustrate a series of flow diagrams of an embodiment of a fabrication process in accordance with the embodiment of FIGS. 5A and 5B.
Figure 6B:
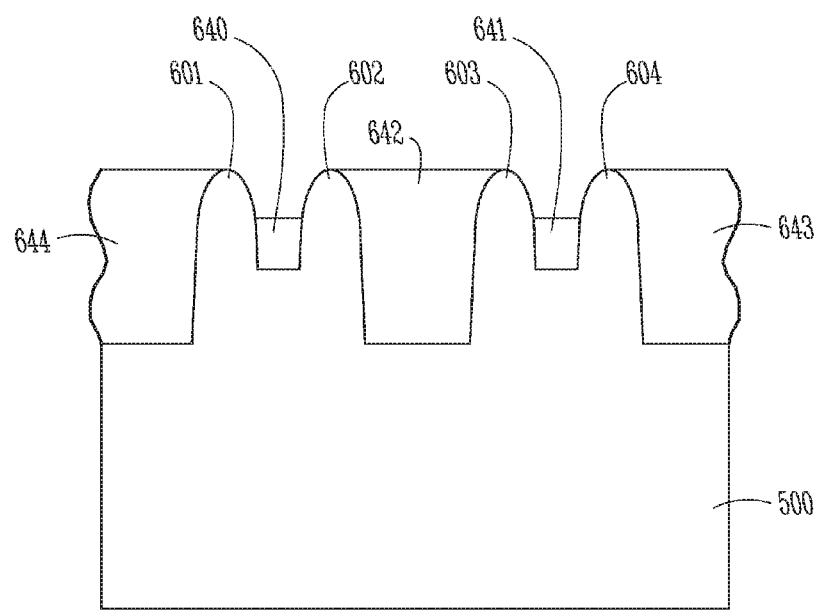

FIGS. 5A, 5B and 5C illustrate cross-sectional views of the DRAM of FIG. 2 incorporating an architecture to reduce access line disturb. FIG. 5A shows a cross-sectional view along the A-A' axis shown in FIG. 2. FIGS. 5B, 5C show a cross-sectional view along the B-B' axis as shown in FIG. 2. FIGS. 5A, 5B and 5C, as well as related FIGS. 6A and 6B, illustrate the reshaping of the access line saddle profile, repositioning of the AC mask areas, and changing of the fin shape and size in order to reduce the passing access line disturb relative to the typical prior art disturb exhibited by the structure of FIGS. 3 and 4.

FIG. 5A shows the substrate (e.g., silicon, germanium) 500 in which the side views of the fins 510-512 are formed. Over each fin 510-512 a respective memory cell 501-503 is formed. The access line metal 531 is formed over an STI AC region 530. A nitride insulator 532 is formed over the access line metal 531.

The distance 520 between the passing access line 531 and active access line (not shown in this view) has been substantially reduced or eliminated.

The cross-sectional view of FIG. 5B shows the substrate 500 (e.g., silicon) in which the fins 620, 621 are formed. Saddle regions 650, 651 are formed in respective fins 620, 621 between the memory cell active areas 601-604. First STI regions 610, 611 (e.g., oxide, nitride) is formed in their respective saddle regions 650, 651. Second STI regions 630 (e.g., nitride, oxide) is formed over the substrate 500. The STI regions 610, 611, 630 are not limited to any one material except that the first STI regions 610, 611 should be a different material than the second STI regions 630. For example if the first STI regions 610, 611 are oxide, the second STI regions 630 are nitride. In an optional embodiment, thin metal regions 590, 591, 592, 593 may not be formed on the STI regions 630 as shown in FIG. 5C FIG. 5B illustrates that the extended STI region pinches off between active areas of adjacent memory cells. Since the first STI regions 610, 611 are a different insulator material (e.g., oxide), they will not pinch off. As seen in FIG. 5B, only the first STI regions 610, 611 (e.g., oxide) are recessed to make the saddle region. This can result in the access line forming saddle regions without making the passing access line deep into the second STI region 630.

The flow diagrams of FIGS. 6A and 6B illustrate an embodiment of a flow process to achieve the structure of FIG. 5B. This flow process uses a different material in the first STI regions 610, 611 than the material used in the second STI regions 630.

Referring to FIG. 6A, STI oxidation is performed in order to fill the thin areas with an oxide material 640, 641. The wider areas are still open and are filled by a nitride material 642-644.

Referring to FIG. 6B, when the access line is formed, substrate material 500 is etched but only the oxide material 640, 641 is recessed. The metal 531 is then filled over the oxide material 640, 641 and the nitride material 642-644, to result in the structure as shown in FIG. 5B.

FIGS. 7-11, FIGS. 12A and 12B illustrate a series of flow diagrams of an embodiment of a fabrication process in accordance with the embodiment of FIGS. 5A and 5B. The flow diagrams of FIGS. 7-12 use the same material in both the first STI regions 610, 611 and the second STI regions 630. Any materials discussed in relation to this fabrication are for purposes of illustration only as materials with substantially similar properties can be substituted.

Figure 7:
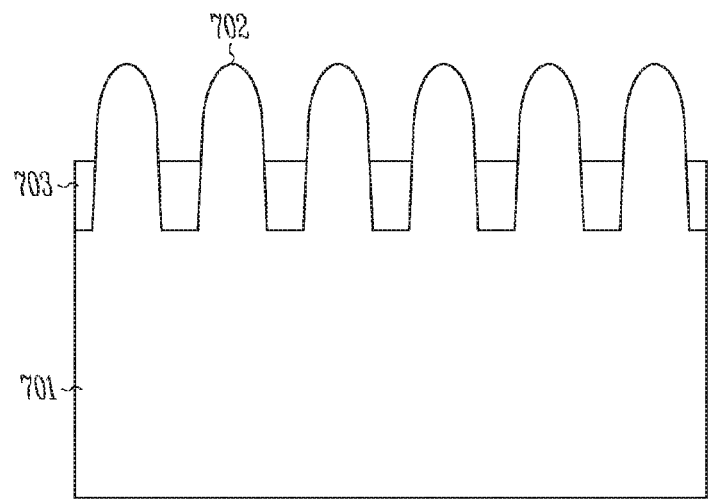
FIGS. 7-11, FIGS. 12A and 12B illustrate a series of flow diagrams of another embodiment of a fabrication process in accordance with the embodiment of FIGS. 5A and 5B.

In FIG. 7, the fabrication uses a bulk 701 (e.g., silicon, germanium) that is etched to form a plurality of continuous fins 702 in the substrate. An insulator material 703 (e.g., oxide, nitride) is deposited between the plurality of fins 702. This can be accomplished by depositing the insulator material 703 then performing an etch process to remove all but the material 703 between the plurality of fins 702.

Figure 8:
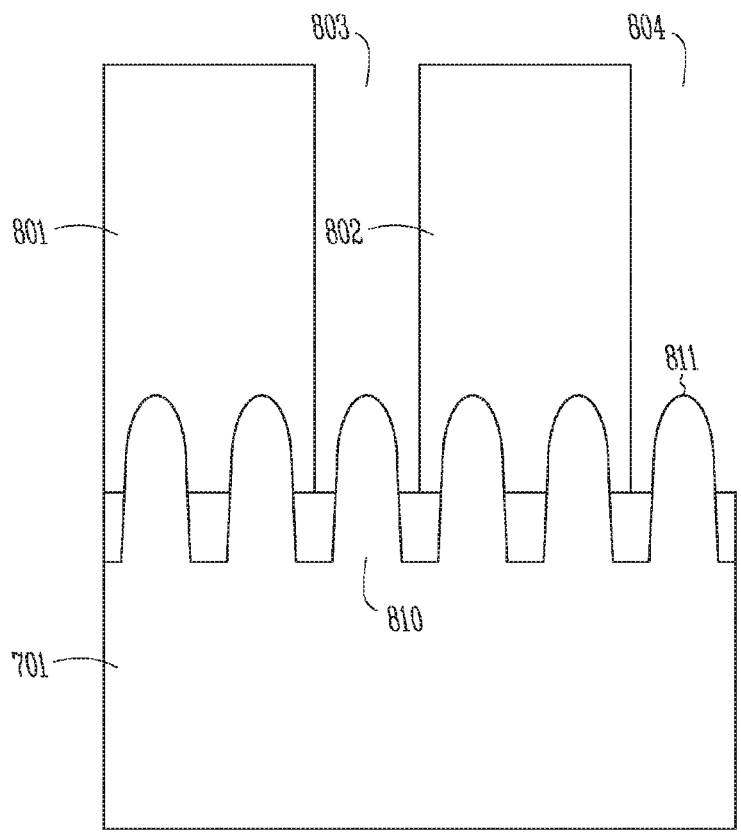

In FIG. 8, a multilayer resist (MLR) material is formed over the insulator material 703 and the substrate 701. The MLR is then etched to remove areas 803, 804 that expose the STI regions and form MLR columns 801, 802. The exposed fin sections 810, 811 of the continuous fins can then be removed by the AC mask process to segment the fins into segmented active areas.

Figure 9:
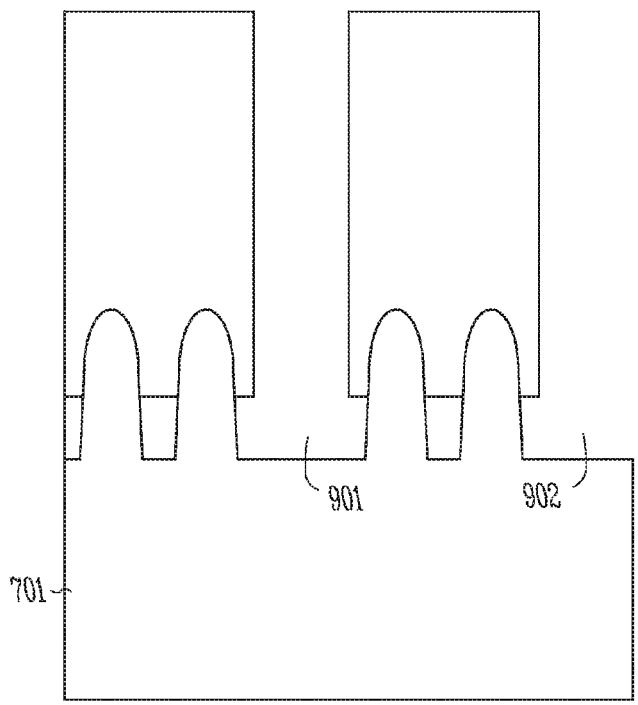

FIG. 9 illustrates the areas 901, 902 where the insulator material and exposed fins 810, 811 appear to have been removed with the AC mask operation. Viewing both the top view in FIG. 2 and the present cross-sectional view of FIG. 9 illustrates that the missing fins are actually the continuous fins (e.g., active areas) being segmented by the AC mask operation into segmented fins. The bulk 701 is now exposed in these areas 901, 902.

Figure 10:
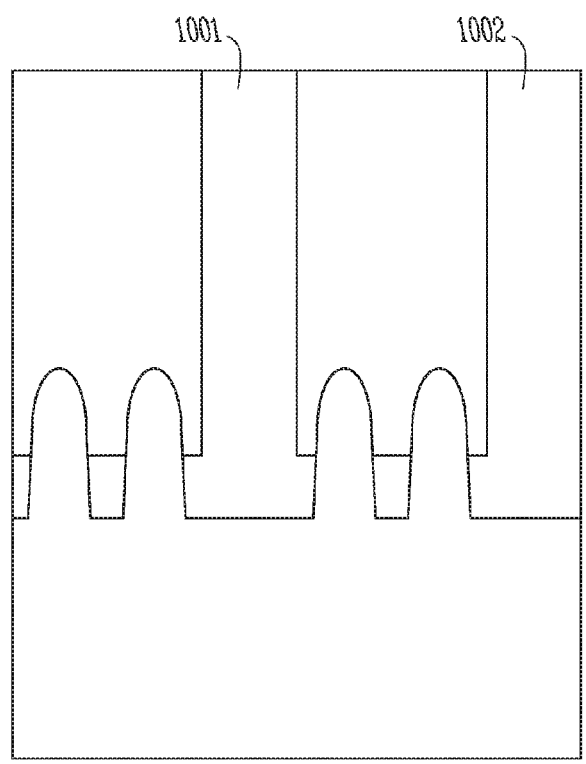
Figure 11:
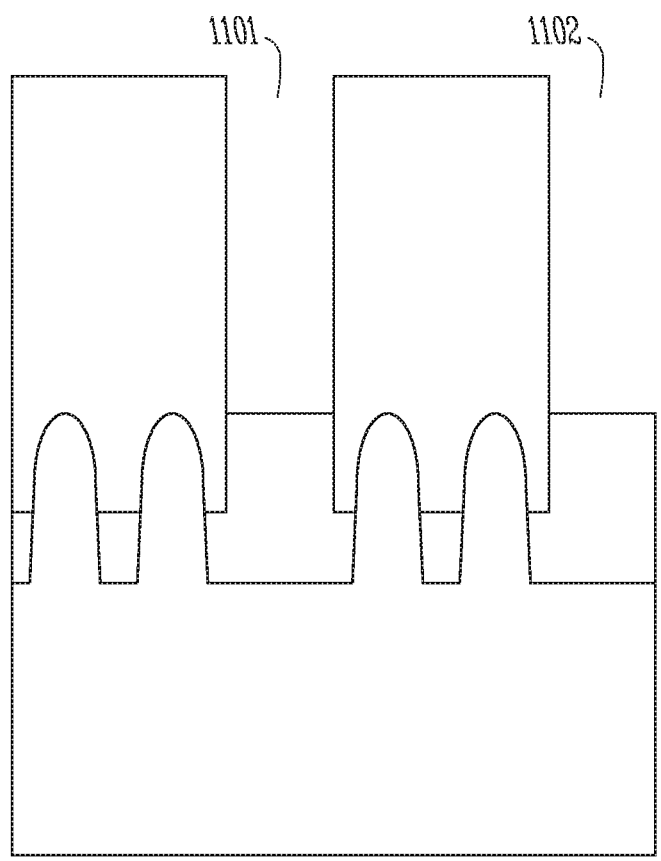

FIG. 10 illustrates that an insulator material (e.g., nitride, oxide) 1001, 1002 is formed in the previously exposed areas 901, 902. A directional etch, illustrated in FIG. 11, is performed to reduce the height of the insulator material 1101, 1102.

Figure 12A:
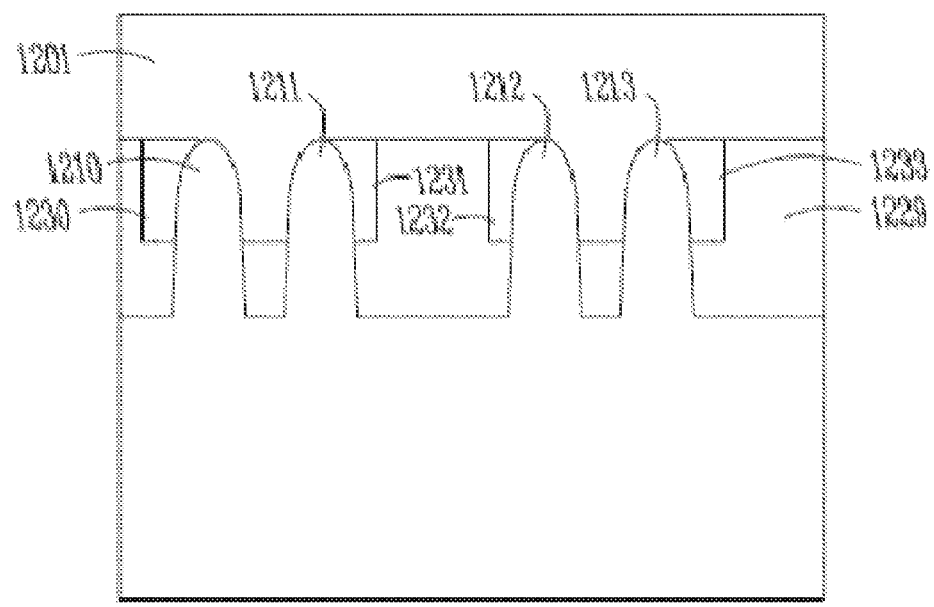
Figure 12B:
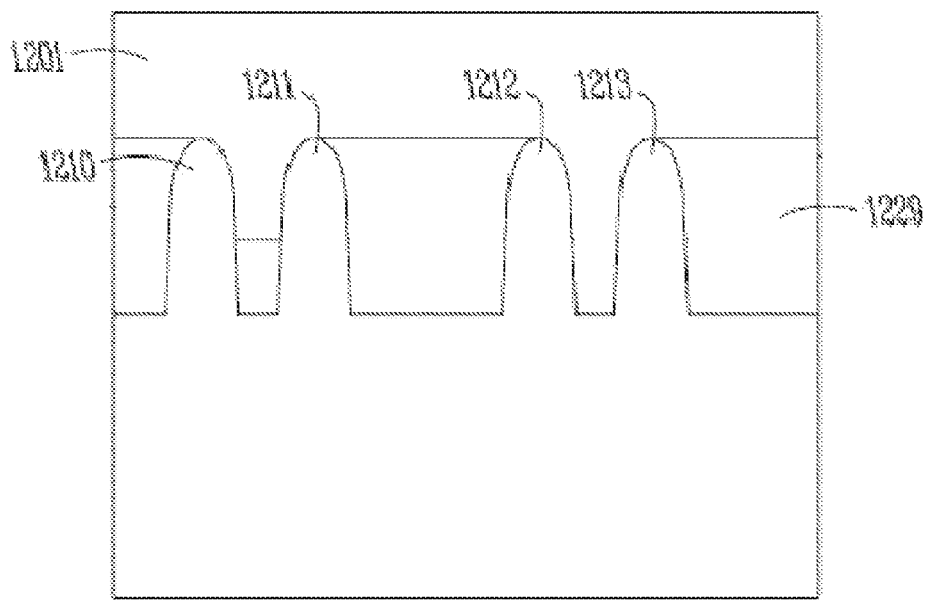

FIG. 12A illustrates that the MLR columns 801, 802 are removed to expose the active areas of the fins 1210-1213 and a metal material 1201 is deposited. The metal material 1201 is the access line. The access line 120 metal is now shallower in the AC regions as compared to the typical prior art. In an optional embodiment, thin metal regions 1230-1233 may not be formed on the STI 1229 as shown in FIG. 12B.

Figure 13:
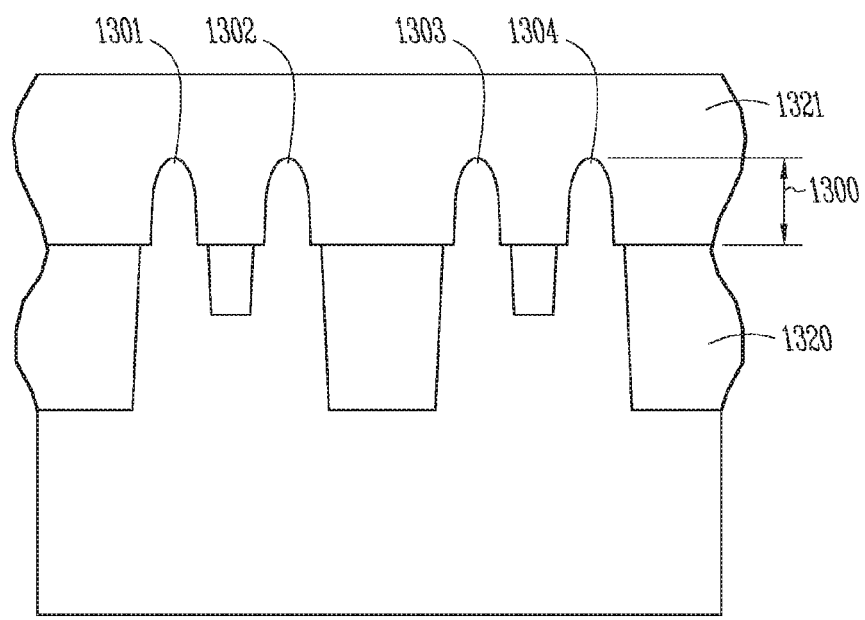
FIG. 13 illustrates a cross-sectional view of the DRAM incorporating an architecture to reduce access line disturb.

FIG. 13 illustrates a cross-sectional view of the DRAM of FIG. 2 incorporating an architecture to reduce access line disturb. This cross-sectional view is along the B-B' axis shown in FIG. 2. FIG. 13, and related FIG. 14 (cross-section along the A-A' axis), illustrate the reshaping of the access line saddle profile, repositioning of the AC mask areas, and changing of the fin shape and size in order to reduce the passing access line disturb relative to the typical prior art disturb.

Figure 14:
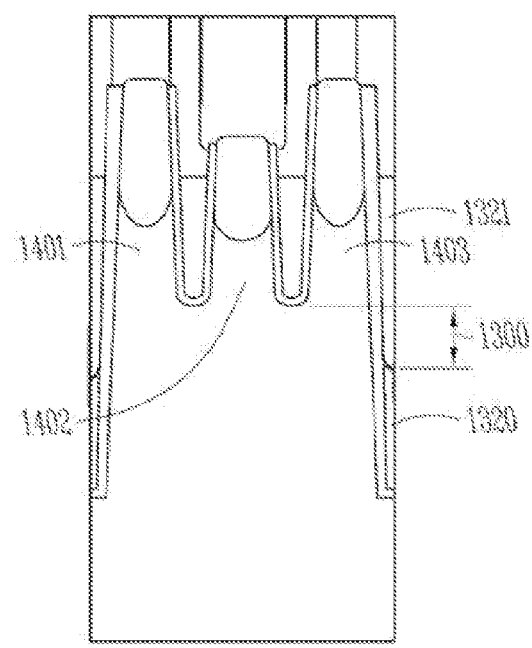
FIG. 14 illustrates another cross-sectional view of the DRAM incorporating an architecture to reduce access line disturb.

The embodiments of FIGS. 13 and 14 use an isotropic etch step to reduce the width of the upper portions of the fin active areas 1301-1304. The reduced width is of the portion of the fins 1301-1304 above the nitride 1320 and surrounded by the metal 1321.

The cross-sectional area of the fin active areas 1401-1402 along the A-A' axis of the embodiment of FIG. 2 is substantially similar to the embodiment of FIG. 5. However, while the embodiment of FIG. 5 shows no distance between the passive access line and the active access line, the embodiment of FIG. 14, with the narrower active areas, shows a distance 1300 between the passive access line and active access line depth 1300. This can improve gate control of the access device and passive access line disturb.

FIGS. 15-18 illustrate a series of fabrication flow diagrams of an embodiment of a fabrication process in accordance with the embodiment of FIGS. 13 and 14. The process flow up to the point of forming the oxide/nitride recess to expose the substrate for forming the saddle regions is substantially similar to the embodiment of FIGS. 5-12.

Figure 15:
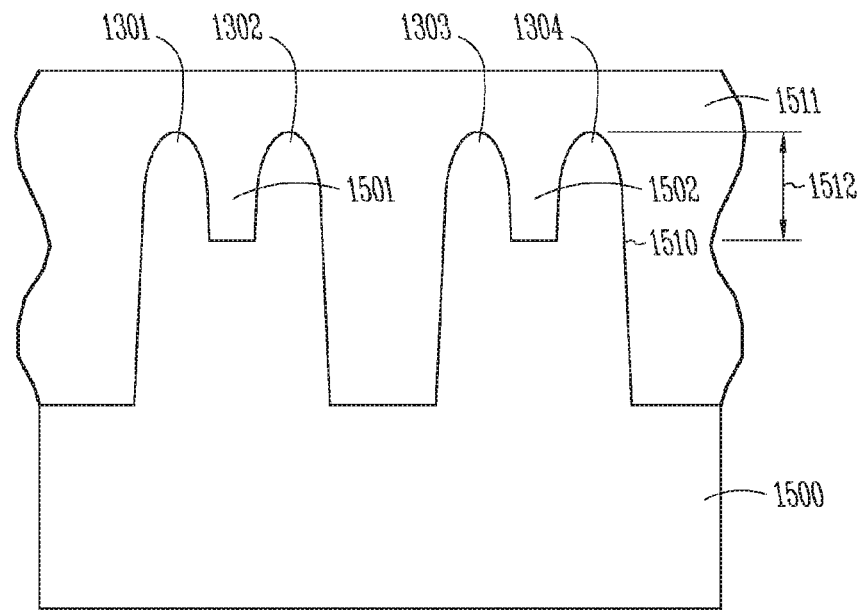
FIGS. 15-18 illustrate a series of fabrication flow diagrams of an embodiment of a fabrication process in accordance with the embodiment of FIGS. 13 and 14.

FIG. 15 shows the saddle regions 1501, 1502 formed between the fins 1301-1304 of the substrate 1500 as a result of the active area AC chop pattern, substrate etch, STI oxidation and nitride fill 1511 steps. The STI oxidation leaves a relatively thin oxide layer 1510 between the substrate 1500 and the STI 1511 (e.g., nitride, oxide).

Figure 16:
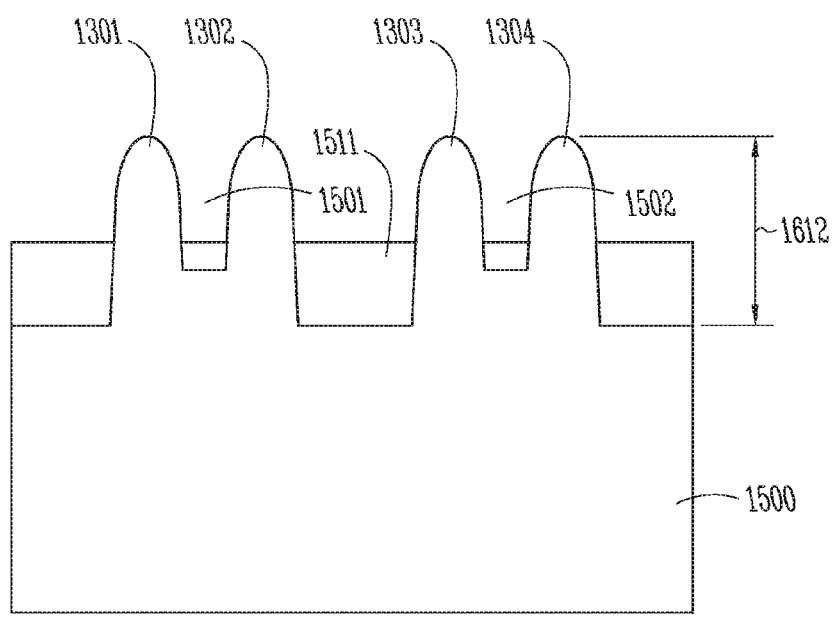

FIG. 16 illustrates an etch step that forms the access lines by etching the saddle regions 1501, 1502 and the nitride 1511 is recessed more to form the fins 1301-1304. The fin height 1512 illustrated in FIG. 15 has been reduced to the fin height 1612 illustrated in FIG. 16.

Figure 17:
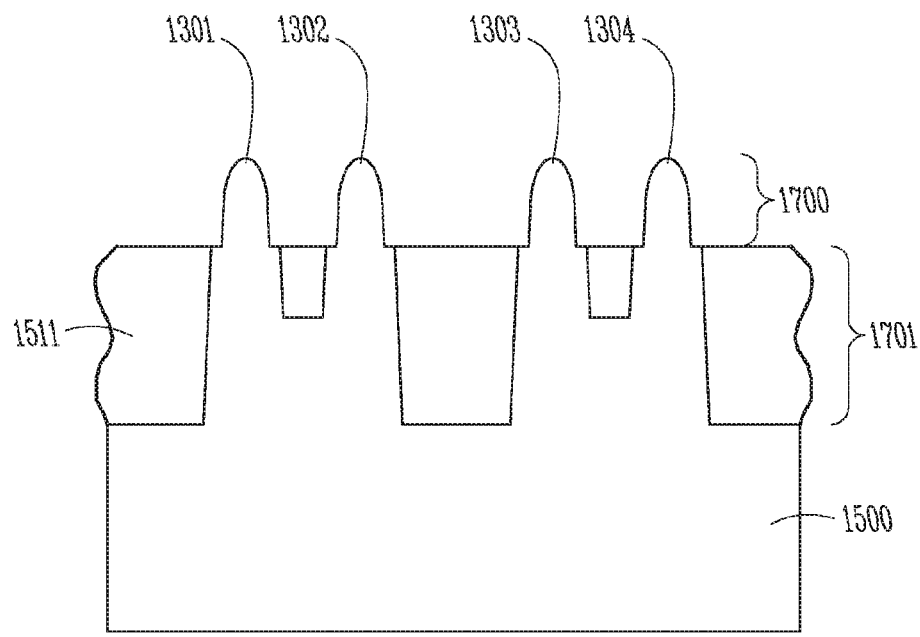

FIG. 17 illustrates an etch step in which the fins 1301-1304 are etched in all directions in order to thin the exposed portions of the fins 1301-1304. This results in the upper portion 1700 of the fin, above the STI 1511 (e.g., nitride, oxide), that has a smaller diameter than the lower portion 1701 of the fin that is surrounded by the STI 1511 (e.g., nitride, oxide).

As the fin thickness is reduced, the passive access line disturb is reduced. Thus, the thinning of the fins 1301-1304 can be adjusted depending on the amount of passive access line disturb reduction desired. This can be a trade-off between the structural integrity of the fins 1301-1304 during fabrication.

Figure 18:
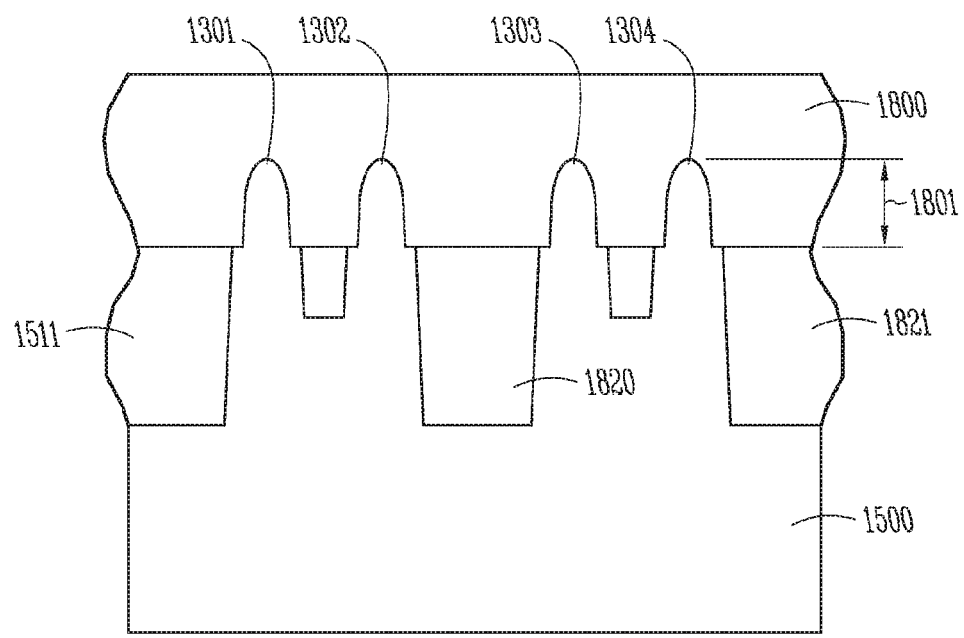

FIG. 18 illustrates a metal deposition step in which a metal 1800 is deposited on the STI 1511 (e.g., nitride, oxide) and substantially surrounding the narrowed fins 1301-1304. These are the active areas 1301-1304 of the memory cells. The embodiment of FIG. 18 shows the AC chop regions 1820, 1821 in the STI 1511 formed over the substrate 1500 (e.g., silicon, germanium). The distance 1801 between the passive access lines and the active access lines is also illustrated.

Figure 19:
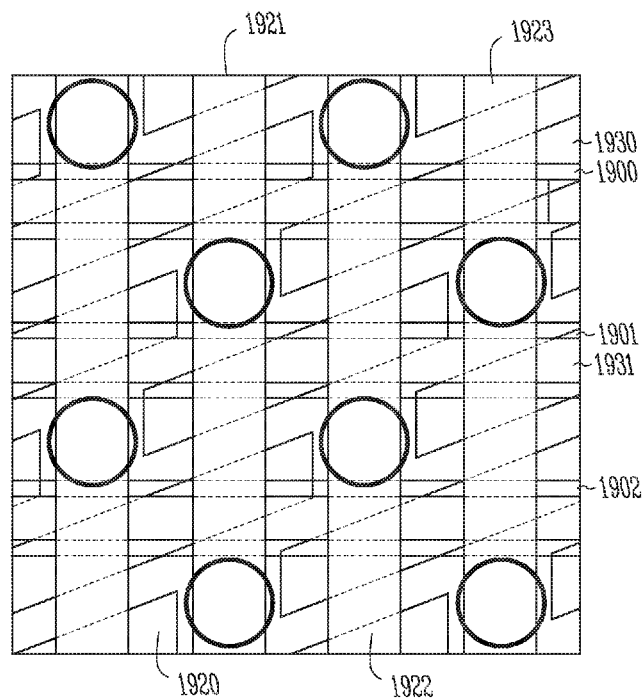
FIG. 19 illustrates a top view of the embodiments of FIGS. 15-18.

FIG. 19 illustrates a top view of the embodiment of FIG. 18. This view shows the data lines 1900-1902, access lines 1920-1923, and the active areas 1930, 1931 as formed in the flow diagrams of FIGS. 15-18.

Figure 20:
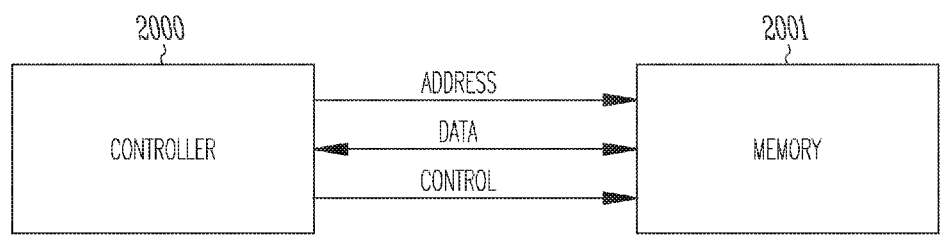
FIG. 20 illustrates a block diagram of a memory system in accordance with various embodiments.

FIG. 20 illustrates a block diagram of a memory system that includes a memory device 2001 according to the various embodiments described previously. A controller 2000 may be used to control operations of the system. The memory device 2001, coupled to the controller 2000, can include a memory array comprising memory cells as fabricated previously.

The controller 2000 may be coupled to the memory device 2001 over control, data, and address buses. In another embodiment, the address and data buses may share a common input/output (I/O) bus. The controller 2000 can be part of the same integrated circuit as the memory device 2001 or as separate integrated circuits.

As used herein, an apparatus may refer to, for example, circuitry, an integrated circuit die, a memory device, a memory array, or a system including such a circuit, die, device or array.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A semiconductor device comprising:
   a plurality of active areas defined by an isolation region, the isolation region including a trench isolation being filled with an insulator material;
   a recessed portion disposed across the plurality of active areas and the isolation region;
   a metal filling at least a part of the recessed portion, wherein the metal extends down to a depth at an active area that is approximately equal to the depth the metal extends down to at an isolation region; and
   wherein the recessed portion comprises fins at the plurality of active areas and the insulator material is formed around the fins.

2. The semiconductor device of claim 1, wherein the fins include a first, a second, a third and a fourth fin aligned continuously, wherein the recessed portion includes a first recessed portion disposed between the first and the second fins, a second recessed portion disposed between the second and the third fins and a third recessed portion disposed between the third and the fourth fins are formed, and wherein a depth the metal extends down to at the first recessed portion and the third recessed portion is substantially equal and a depth the metal extends down to at the second recessed portion is less than the depth the metal extends down to at the first recessed portion.

3. The semiconductor device of claim 2, wherein a depth of the insulator material in the second recessed portion is greater than a depth of the insulator material of the first recessed portion.

4. The semiconductor device of claim 3, wherein a height of the insulator material in the first recessed portion is substantially equal to a height of the insulator material in the third recessed portion.

5. The semiconductor device of claim 2, wherein the insulator material comprises a first insulator and further comprises a second insulator material in the second recessed portion, wherein the first insulator material is different from the second insulator material.

6. The semiconductor device of claim 3, wherein the first insulator material includes a nitride and the second material includes an oxide.

7. The semiconductor device of claim 2, wherein the insulator material in the second recessed portion directly contact with at an each top portion of the second and the third fins.

8. A semiconductor device comprising:
   a plurality of active areas defined by an isolation region, the isolation region including a trench isolation being filled with an insulator material;
   a first and a second recessed portions disposed parallel across the plurality of active areas in a direction and adjacently; and
   a metal filling at least a part of the first and the second recessed portions, wherein a depth the metal extends down to at an active area of the first recessed portion is approximately equal to a depth the metal extends down to at an isolation region of the second recessed portion; and
   wherein the first and the second recessed portions comprises fins at the plurality of active areas respectively and the insulator material is formed around the fins.

9. The semiconductor device of claim 8, further comprising a third recessed portion disposed adjacent to the first recessed portion and opposite side of the second recessed portion, wherein a depth of the metal at an active area of the first recessed portion is substantially equal to a depth of the metal at an active area of the third recessed portion.

10. A semiconductor device comprising:
a first active region of semiconductor material;
an isolation region surrounding the active region, the isolation region comprising a first trench and an insulating material filling the first trench;
a second trench crossing the first active region to form a first recess in the first active region, the first recess being shallower in depth than the first trench;
a third trench formed in the isolation region substantially parallel to the second trench to form a second recess in the insulating material of the isolation region, the second recess being approximately equal in depth to the first recess;
a first conductive layer formed in the second trench to fill at least a part of the first recess; and
a second conductive layer formed in the third trench to fill at least a part of the second recess.

11. The device of claim 10, wherein the active region includes a fin at a portion of the first recess.

12. The device of claim 10, wherein the device further comprises a second active region of semiconductor material disposed in substantially parallel to the first active region;
wherein the isolation region further surrounds the second active region;
wherein the second trench is elongated toward the isolation region in substantially parallel to the third trench to form a third recess in the insulating material of the isolation region, the third recess being approximately equal in depth to each of the first and second recesses;
wherein the third trench is elongated toward the second active region in substantially parallel to the second trench to form a fourth recess in the second active region, the fourth recess being approximately equal in depth to each of the first, second and third recesses;
wherein the first conductive layer is formed to fill at least a part of the third recess; and
wherein the second conductive layer if formed to fill at least a part of the fourth recess.

13. The device of claim 12, further comprising:
a third active region of semiconductor material disposed in substantially parallel to the first active region, the third active region being surrounded by the isolation region:
a fourth trench formed in substantially parallel to each of the first and second trenches to cross the first active region to form a fifth recess in the first active region and cross the third active region to form a sixth recess in the third active region, each of the fifth and sixth recesses being approximately equal to each of the first, second, third and fourth recesses; and
a third conductive layer formed in the fourth trench to fill at least respective parts of the fifth and sixth recesses.

14. The device of claim 13, wherein the second trench is elongated to pass between the second and third active regions.

15. The device of claim 14, wherein the second and third active regions are arranged in line.

16. The device of claim 15, further comprising:
a fifth trench crossing the second active region in substantially parallel to and apart from the second trench;
a sixth trench crossing the third active region in substantially parallel to and apart from the fourth trench;
a fourth conductive layer formed in the fifth trench; and
a fifth conductive layer formed in the sixth trench.

17. The device of claim 16, wherein each of the first, second, third, fourth and fifth conductive layer serves as a word line of a memory device.

18. The device of claim 16, further comprising first, second, third, fourth, fifth and sixth capacitors, each of the first and second capacitors electrically connected to the first active region, each of the third and fourth capacitors electrically connected to the second active region, and each of the fifth and sixth capacitors electrically connected to the third active region.

* * * * *